(12) United States Patent
Brick et al.

(10) Patent No.: US 12,189,280 B2
(45) Date of Patent: *Jan. 7, 2025

(54) LIGHTING ARRANGEMENT, LIGHT GUIDE ARRANGEMENT AND METHOD

(71) Applicant: OSRAM Opto Semiconductors GmbH, Regensburg (DE)

(72) Inventors: Peter Brick, Regensburg (DE); Frank Singer, Regenstauf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/612,834

(22) PCT Filed: Mar. 26, 2020

(86) PCT No.: PCT/EP2020/058549
§ 371 (c)(1),
(2) Date: Nov. 19, 2021

(87) PCT Pub. No.: WO2020/233873
PCT Pub. Date: Nov. 26, 2020

(65) Prior Publication Data
US 2022/0244627 A1    Aug. 4, 2022

(30) Foreign Application Priority Data

May 23, 2019 (DE) .................... 10 2019 113 793.4
Jul. 4, 2019 (DE) .................... 10 2019 118 082.1
Jan. 29, 2020 (WO) ................ PCT/EP2020/052191

(51) Int. Cl.
*G03B 21/20* (2006.01)
*G02B 27/01* (2006.01)
(Continued)

(52) U.S. Cl.
CPC ..... *G03B 21/2033* (2013.01); *G02B 27/0103* (2013.01); *G02B 27/30* (2013.01); *H01L 25/0753* (2013.01); *H01L 27/156* (2013.01)

(58) Field of Classification Search
CPC .............. G03B 21/2033; G03B 21/147; G03B 21/2013; G03B 21/2046; G03B 21/14;
(Continued)

(56) References Cited

U.S. PATENT DOCUMENTS 4,897,614 A    1/1990   Nishio
4,979,002 A    12/1990  Pankove
(Continued)

FOREIGN PATENT DOCUMENTS

DE    19744793 A1    4/1998
DE    19751649 A1    5/1999
(Continued)

OTHER PUBLICATIONS

International Search Report issued in corresponding International Application No. PCT/EP2020/058549 dated Sep. 30, 2020.
(Continued)

*Primary Examiner* — Magda Cruz
(74) *Attorney, Agent, or Firm* — ArentFox Schiff LLP

(57) ABSTRACT

The invention relates to an illumination arrangement comprising a light-emitting optoelectronic element and an optical device for beam conversion of electromagnetic radiation generated by the light-emitting optoelectronic element. The light emitting optoelectronic element comprises a plurality of emission areas arranged in matrix form; and each emission region is associated with a main beam direction. At least a portion of the emission areas is arranged such that the centers of the emission areas lie on a curved surface.

30 Claims, 13 Drawing Sheets

(51) Int. Cl.
  *G02B 27/30* (2006.01)
  *H01L 25/075* (2006.01)
  *H01L 27/15* (2006.01)

(58) Field of Classification Search
  CPC .............. G02B 27/0103; G02B 27/30; G02B 2027/011; G02B 13/16; G02B 2027/0105; G02B 2027/0112; H01L 25/0753; H01L 27/156; H01L 33/58; H01L 25/0756; H01L 25/167; H05K 1/183; H05K 2201/10106; H05K 1/0274; H05K 1/0284; H05K 2201/09845
  See application file for complete search history.

(56) References Cited

U.S. PATENT DOCUMENTS

| | | | |
|---|---|---|---|
| 5,103,271 A | 4/1992 | Izumiya et al. | |
| 5,526,063 A | 7/1996 | Joubert et al. | |
| 5,537,171 A | 7/1996 | Ogino et al. | |
| 5,858,814 A | 1/1999 | Goossen et al. | |
| 6,048,751 A | 4/2000 | D'Asaro et al. | |
| 6,316,286 B1 | 11/2001 | Trezza | |
| 6,527,456 B1 | 3/2003 | Trezza | |
| 6,881,982 B2 | 4/2005 | Okuyama et al. | |
| 7,067,339 B2 | 6/2006 | Biwa et al. | |
| 7,101,050 B2 * | 9/2006 | Magarill | G03B 21/208 348/E5.143 |
| 7,254,282 B2 | 8/2007 | Sathyanarayana | |
| 7,390,097 B2 * | 6/2008 | Magarill | G02B 19/0066 353/38 |
| 7,808,005 B1 | 10/2010 | Fattal et al. | |
| 8,049,233 B2 | 11/2011 | Fukshima et al. | |
| 8,349,116 B1 | 1/2013 | Bibl et al. | |
| 8,536,026 B2 | 9/2013 | Park et al. | |
| 8,586,965 B2 | 11/2013 | Toyoda et al. | |
| 8,816,324 B2 | 8/2014 | Fukui et al. | |
| 9,202,988 B2 | 12/2015 | Yoshida et al. | |
| 9,318,645 B2 | 4/2016 | Tani et al. | |
| 9,368,683 B1 | 6/2016 | Meitl et al. | |
| 9,437,782 B2 | 9/2016 | Bower et al. | |
| 9,444,015 B2 | 9/2016 | Bower et al. | |
| 9,472,734 B1 | 10/2016 | Chen et al. | |
| 9,520,537 B2 | 12/2016 | Bower et al. | |
| 9,698,308 B2 | 7/2017 | Bower et al. | |
| 9,705,042 B2 | 7/2017 | Bower et al. | |
| 9,923,013 B1 | 3/2018 | Yamashita et al. | |
| 9,991,423 B2 | 6/2018 | Bower et al. | |
| 9,997,102 B2 | 6/2018 | Rotzoll et al. | |
| 10,069,036 B2 | 9/2018 | Atanackovic | |
| 10,096,585 B2 | 10/2018 | Tanaka et al. | |
| 10,147,849 B2 | 12/2018 | Xu et al. | |
| 10,162,182 B2 | 12/2018 | Jepsen | |
| 10,177,195 B2 | 1/2019 | Ahmed et al. | |
| 10,224,460 B2 | 3/2019 | Bower et al. | |
| 10,395,589 B1 | 8/2019 | Vahid Far et al. | |
| 10,396,241 B1 | 8/2019 | Perkins | |
| 10,405,406 B2 | 9/2019 | Liszt | |
| 10,418,517 B2 | 9/2019 | Atanackovic | |
| 10,446,719 B2 | 10/2019 | Bower et al. | |
| 10,466,487 B2 | 11/2019 | Blum et al. | |
| 10,490,695 B2 | 11/2019 | Gomez Iglesias et al. | |
| 10,522,787 B1 | 12/2019 | Montgomery et al. | |
| 10,622,514 B1 | 4/2020 | Atanackovic | |
| 10,802,334 B2 | 10/2020 | Kim et al. | |
| 10,833,225 B2 | 11/2020 | Bower et al. | |
| 10,903,193 B2 | 1/2021 | Yamada | |
| 10,963,103 B1 | 3/2021 | Shahmohammadi | |
| 10,985,143 B2 | 4/2021 | Bower et al. | |
| 11,156,759 B2 * | 10/2021 | Brick | G02B 26/101 |
| 11,367,807 B2 | 6/2022 | Wada et al. | |
| 11,513,275 B2 * | 11/2022 | Brick | G02B 26/101 |
| 11,538,852 B2 | 12/2022 | Varghese et al. | |
| 11,552,057 B2 | 1/2023 | Chae et al. | |
| 2002/0072138 A1 | 6/2002 | Trezza et al. | |
| 2002/0074553 A1 | 6/2002 | Starikov et al. | |
| 2003/0013230 A1 | 1/2003 | Dudoff et al. | |
| 2003/0141507 A1 | 7/2003 | Krames et al. | |
| 2003/0168666 A1 | 9/2003 | Okuyama et al. | |
| 2003/0189125 A1 | 10/2003 | Trierenberg | |
| 2004/0146219 A1 | 7/2004 | Sathyanarayana | |
| 2004/0189627 A1 | 9/2004 | Shirasaki et al. | |
| 2005/0174768 A1 * | 8/2005 | Conner | G02B 27/148 348/E9.027 |
| 2005/0194598 A1 | 9/2005 | Kim et al. | |
| 2005/0237488 A1 | 10/2005 | Yamasaki et al. | |
| 2005/0264472 A1 | 12/2005 | Rast | |
| 2006/0002247 A1 | 1/2006 | Kim et al. | |
| 2006/0163435 A1 | 7/2006 | Russom et al. | |
| 2006/0164345 A1 | 7/2006 | Sarma et al. | |
| 2006/0192225 A1 | 8/2006 | Chua et al. | |
| 2007/0057249 A1 | 3/2007 | Kim et al. | |
| 2007/0096127 A1 | 5/2007 | Pattison et al. | |
| 2008/0061304 A1 | 3/2008 | Huang et al. | |
| 2008/0160725 A1 | 7/2008 | Byun et al. | |
| 2009/0045416 A1 | 2/2009 | Bierhuizen et al. | |
| 2009/0229097 A1 | 9/2009 | Crandemire | |
| 2009/0291237 A1 | 11/2009 | Park et al. | |
| 2009/0315054 A1 | 12/2009 | Kim et al. | |
| 2010/0019693 A1 | 1/2010 | Hoogzaad et al. | |
| 2010/0019697 A1 | 1/2010 | Korsunsky et al. | |
| 2010/0163894 A1 | 7/2010 | Uemura et al. | |
| 2010/0252103 A1 | 10/2010 | Yao et al. | |
| 2010/0317132 A1 | 12/2010 | Rogers et al. | |
| 2011/0151602 A1 | 6/2011 | Speier | |
| 2011/0156070 A1 | 6/2011 | Yoon et al. | |
| 2011/0156616 A1 | 6/2011 | Anderson et al. | |
| 2011/0204327 A1 | 8/2011 | Hiruma et al. | |
| 2011/0254043 A1 | 10/2011 | Negishi et al. | |
| 2011/0263054 A1 | 10/2011 | Yu et al. | |
| 2012/0126229 A1 | 5/2012 | Bower | |
| 2012/0223289 A1 | 9/2012 | Gwo et al. | |
| 2012/0223873 A1 | 9/2012 | Ohta | |
| 2013/0063413 A1 | 3/2013 | Miyake | |
| 2013/0063815 A1 | 3/2013 | Kubota | |
| 2013/0082624 A1 | 4/2013 | Brassfield et al. | |
| 2013/0119424 A1 | 5/2013 | Kang et al. | |
| 2013/0154498 A1 | 6/2013 | Missbach | |
| 2013/0208273 A1 * | 8/2013 | Dominguez-Caballero | G01J 3/0205 349/97 |
| 2013/0249972 A1 | 9/2013 | Nishino et al. | |
| 2013/0328066 A1 | 12/2013 | Sabathil et al. | |
| 2014/0008677 A1 | 1/2014 | Zhu et al. | |
| 2014/0054619 A1 | 2/2014 | Tseng et al. | |
| 2014/0111559 A1 | 4/2014 | Yang et al. | |
| 2014/0131753 A1 | 5/2014 | Ishida et al. | |
| 2014/0159064 A1 | 6/2014 | Sakariya et al. | |
| 2014/0319560 A1 | 10/2014 | Tischler | |
| 2014/0340900 A1 | 11/2014 | Bathurst et al. | |
| 2015/0103070 A1 | 4/2015 | In et al. | |
| 2015/0103404 A1 | 4/2015 | Rudy et al. | |
| 2015/0162560 A1 | 6/2015 | Chen et al. | |
| 2015/0186099 A1 | 7/2015 | Hall | |
| 2015/0187991 A1 | 7/2015 | McGroddy et al. | |
| 2015/0207399 A1 | 7/2015 | Li et al. | |
| 2015/0280086 A1 | 10/2015 | Jang et al. | |
| 2015/0293302 A1 | 10/2015 | Czornomaz et al. | |
| 2016/0013167 A1 | 1/2016 | Sakariya et al. | |
| 2016/0155892 A1 | 6/2016 | Li et al. | |
| 2016/0172253 A1 | 6/2016 | Wu et al. | |
| 2016/0185277 A1 * | 6/2016 | Cho | H05B 45/00 362/249.01 |
| 2016/0240159 A1 | 8/2016 | Ohkawa et al. | |
| 2016/0315218 A1 | 10/2016 | Bour et al. | |
| 2016/0341942 A1 | 11/2016 | Cheon et al. | |
| 2016/0351539 A1 | 12/2016 | Bower et al. | |
| 2017/0005151 A1 | 1/2017 | Kim et al. | |
| 2017/0061878 A1 | 3/2017 | Park et al. | |
| 2017/0082263 A1 | 3/2017 | Byrnes et al. | |
| 2017/0084775 A1 | 3/2017 | Li et al. | |
| 2017/0133357 A1 | 5/2017 | Kuo et al. | |
| 2017/0170360 A1 | 6/2017 | Bour et al. | |
| 2017/0179097 A1 | 6/2017 | Zhang et al. | |

(56) References Cited

U.S. PATENT DOCUMENTS

| | | | |
|---|---|---|---|
| 2017/0179192 A1 | 6/2017 | Zhang et al. |
| 2017/0186740 A1 | 6/2017 | Cok et al. |
| 2017/0186908 A1 | 6/2017 | Robin et al. |
| 2017/0236885 A1 | 8/2017 | Koshihara et al. |
| 2017/0254518 A1 | 9/2017 | Vasylyev |
| 2017/0270852 A1 | 9/2017 | Meitl et al. |
| 2017/0278733 A1 | 9/2017 | Chang et al. |
| 2017/0287402 A1 | 10/2017 | Toyomura et al. |
| 2017/0352309 A1 | 12/2017 | Chang et al. |
| 2017/0352313 A1 | 12/2017 | Miyake |
| 2017/0371087 A1 | 12/2017 | You et al. |
| 2018/0005562 A1 | 1/2018 | Lin et al. |
| 2018/0012540 A1 | 1/2018 | Hosoyachi et al. |
| 2018/0024412 A1 | 1/2018 | Kim et al. |
| 2018/0033768 A1 | 2/2018 | Kumar et al. |
| 2018/0075798 A1 | 3/2018 | Nho et al. |
| 2018/0084614 A1 | 3/2018 | Bower et al. |
| 2018/0097033 A1 | 4/2018 | Ahmed et al. |
| 2018/0114878 A1 | 4/2018 | Danesh et al. |
| 2018/0180249 A1 | 6/2018 | Yamada et al. |
| 2018/0182298 A1 | 6/2018 | Jang et al. |
| 2018/0190712 A1 | 7/2018 | Xu et al. |
| 2018/0211595 A1 | 7/2018 | Takahashi et al. |
| 2018/0211945 A1 | 7/2018 | Cok et al. |
| 2018/0219144 A1 | 8/2018 | Perkins et al. |
| 2018/0226386 A1 | 8/2018 | Cok |
| 2018/0247586 A1 | 8/2018 | Vahid Far et al. |
| 2018/0269234 A1 | 9/2018 | Hughes et al. |
| 2018/0275410 A1 | 9/2018 | Yeoh et al. |
| 2018/0301433 A1 | 10/2018 | Robin et al. |
| 2018/0308832 A1 | 10/2018 | Shin et al. |
| 2018/0323116 A1 | 11/2018 | Wu et al. |
| 2018/0331258 A1 | 11/2018 | Halbritter et al. |
| 2018/0342492 A1 | 11/2018 | Lu |
| 2018/0358339 A1 | 12/2018 | Iguchi |
| 2018/0358340 A1 | 12/2018 | Wong et al. |
| 2018/0367769 A1 | 12/2018 | Greenberg |
| 2019/0012957 A1 | 1/2019 | Liu et al. |
| 2019/0012965 A1 | 1/2019 | Fu et al. |
| 2019/0013439 A1 | 1/2019 | Sung et al. |
| 2019/0044023 A1 | 2/2019 | Cheng et al. |
| 2019/0058081 A1 | 2/2019 | Ahmed et al. |
| 2019/0066571 A1 | 2/2019 | Goward |
| 2019/0066587 A1 * | 2/2019 | Han |
| 2019/0113199 A1 * | 4/2019 | Pellarin .............. F21S 41/321 |
| 2019/0113727 A1 | 4/2019 | Tamma |
| 2019/0115508 A1 | 4/2019 | Lin et al. |
| 2019/0137757 A1 | 5/2019 | Rousseau |
| 2019/0148606 A1 | 5/2019 | Racz et al. |
| 2019/0165209 A1 | 5/2019 | Bonar et al. |
| 2019/0174079 A1 | 6/2019 | Anthony et al. |
| 2019/0195466 A1 | 6/2019 | Shimizu et al. |
| 2019/0198716 A1 | 6/2019 | Gordon et al. |
| 2019/0229097 A1 | 7/2019 | Takeya et al. |
| 2019/0235234 A1 | 8/2019 | Hu et al. |
| 2019/0235677 A1 | 8/2019 | Liu et al. |
| 2019/0258346 A1 | 8/2019 | Cheng et al. |
| 2019/0273471 A1 | 9/2019 | Ahmed et al. |
| 2019/0293939 A1 | 9/2019 | Sluka |
| 2019/0302917 A1 | 10/2019 | Pan |
| 2019/0305035 A1 | 10/2019 | Cho et al. |
| 2019/0305036 A1 | 10/2019 | Ahn et al. |
| 2019/0305185 A1 | 10/2019 | Lauermann et al. |
| 2019/0335553 A1 | 10/2019 | Ahmed et al. |
| 2019/0347979 A1 | 11/2019 | Ahmed |
| 2019/0378674 A1 | 12/2019 | Chou et al. |
| 2019/0383474 A1 * | 12/2019 | Vasylyev ............. G02B 6/0083 |
| 2019/0386173 A1 | 12/2019 | Chen et al. |
| 2019/0393198 A1 | 12/2019 | Takeya |
| 2020/0052033 A1 | 2/2020 | Iguchi |
| 2020/0105184 A1 | 4/2020 | Shao et al. |
| 2020/0119233 A1 | 4/2020 | Dupont |
| 2020/0134624 A1 | 4/2020 | Zhang et al. |
| 2020/0203580 A1 | 6/2020 | Marutani |
| 2020/0219855 A1 | 7/2020 | Chen et al. |
| 2020/0227594 A1 | 7/2020 | Kuo |
| 2020/0251638 A1 | 8/2020 | Morris et al. |
| 2020/0342194 A1 | 10/2020 | Bhat et al. |
| 2020/0343230 A1 | 10/2020 | Sizov et al. |
| 2020/0356016 A1 | 11/2020 | Sampayan et al. |
| 2020/0357103 A1 | 11/2020 | Wippermann et al. |
| 2020/0366067 A1 | 11/2020 | David et al. |
| 2021/0005775 A1 | 1/2021 | Chen et al. |
| 2021/0043617 A1 | 2/2021 | Onuma et al. |
| 2021/0080637 A1 | 3/2021 | Brick et al. |
| 2021/0083152 A1 | 3/2021 | Biebersdorf et al. |
| 2021/0104574 A1 | 4/2021 | Behringer et al. |
| 2021/0124247 A1 * | 4/2021 | Mezouari .......... G02F 1/133605 |
| 2021/0134624 A1 | 5/2021 | Zhang |
| 2021/0136966 A1 | 5/2021 | Jang et al. |
| 2021/0166618 A1 | 6/2021 | Baumheinrich et al. |
| 2021/0242370 A1 | 8/2021 | Lee et al. |
| 2021/0272938 A1 | 9/2021 | Chang et al. |
| 2021/0313497 A1 | 10/2021 | Pourquier |
| 2021/0325594 A1 | 10/2021 | Meng et al. |
| 2021/0375833 A1 | 12/2021 | Lee et al. |
| 2021/0391514 A1 | 12/2021 | Koyama et al. |
| 2021/0405276 A1 | 12/2021 | Brick et al. |
| 2022/0051614 A1 | 2/2022 | Baumheinrich et al. |
| 2022/0052027 A1 | 2/2022 | Brick et al. |
| 2022/0052235 A1 | 2/2022 | Biebersdorf et al. |
| 2022/0093833 A1 | 3/2022 | Takiguchi et al. |
| 2022/0101781 A1 | 3/2022 | Baumheinrich et al. |
| 2022/0102583 A1 | 3/2022 | Baumheinrich et al. |
| 2022/0123046 A1 | 4/2022 | Behringer et al. |
| 2022/0231193 A1 | 7/2022 | Boss et al. |
| 2022/0262850 A1 | 8/2022 | Behringer et al. |
| 2022/0262851 A1 | 8/2022 | Behringer et al. |
| 2022/0262852 A1 | 8/2022 | Behringer et al. |
| 2022/0271084 A1 | 8/2022 | Behringer et al. |
| 2022/0271085 A1 | 8/2022 | Behringer et al. |
| 2022/0285430 A1 | 9/2022 | Behringer et al. |
| 2022/0285591 A1 | 9/2022 | Biebersdorf et al. |
| 2022/0285592 A1 | 9/2022 | Biebersdorf et al. |
| 2022/0293829 A1 | 9/2022 | Biebersdorf et al. |
| 2022/0293830 A1 | 9/2022 | Biebersdorf et al. |
| 2022/0310888 A1 | 9/2022 | Biebersdorf et al. |
| 2022/0352436 A1 | 11/2022 | Biebersdorf et al. |
| 2022/0375991 A1 | 11/2022 | Behringer et al. |

FOREIGN PATENT DOCUMENTS

| | | | |
|---|---|---|---|
| DE | 19911717 A1 | 9/2000 | |
| DE | 10009782 A1 | 9/2001 | |
| DE | 102006045702 A1 | 4/2008 | |
| DE | 102007043877 A1 | 1/2009 | |
| DE | 102007046339 A1 | 4/2009 | |
| DE | 102005063159 B4 | 5/2009 | |
| DE | 102012008833 A1 * | 11/2012 | ............ F21S 41/141 |
| DE | 102013104273 A1 | 10/2014 | |
| DE | 102017106755 A1 | 10/2018 | |
| DE | 102017109083 A1 | 10/2018 | |
| DE | 102018108022 A1 | 10/2018 | |
| DE | 102017114369 A1 | 1/2019 | |
| DE | 102018113363 A1 | 12/2019 | |
| DE | 102018119312 A1 | 2/2020 | |
| DE | 102018119376 A1 | 2/2020 | |
| EP | 0488772 A1 | 6/1992 | |
| EP | 1544660 A1 | 6/2005 | |
| EP | 1553640 A1 | 7/2005 | |
| EP | 1887634 A2 | 2/2008 | |
| EP | 2323185 A2 | 5/2011 | |
| EP | 2396818 A2 | 12/2011 | |
| EP | 2430652 A1 | 3/2012 | |
| EP | 2609624 A0 | 3/2012 | |
| EP | 2477240 A1 | 7/2012 | |
| EP | 2506321 A1 | 10/2012 | |
| EP | 2642537 A2 | 9/2013 | |
| EP | 2685155 A2 | 1/2014 | |
| EP | 2750208 A2 | 7/2014 | |
| EP | 2838130 A1 | 2/2015 | |
| EP | 2924490 A2 | 9/2015 | |
| EP | 2980866 A1 | 2/2016 | |
| EP | 2986082 A1 | 2/2016 | |

(56) References Cited

FOREIGN PATENT DOCUMENTS

| | | |
|---|---|---|
| EP | 3010048 A1 | 4/2016 |
| EP | 3031086 A1 | 6/2016 |
| EP | 2676528 B1 | 8/2017 |
| EP | 3226042 A1 | 10/2017 |
| EP | 2704215 B1 | 4/2018 |
| EP | 3367374 A1 | 8/2018 |
| JP | S62269385 A | 11/1987 |
| JP | H06244457 A | 9/1994 |
| JP | 2004-228297 A | 8/2004 |
| JP | 2005244220 A | 9/2005 |
| JP | 2005346066 A | 12/2005 |
| JP | 2007264610 A | 10/2007 |
| JP | 2007324416 A | 12/2007 |
| JP | 2009141254 A | 6/2009 |
| JP | 2009186794 A | 8/2009 |
| JP | 2009260357 A | 11/2009 |
| JP | 2010272245 A | 12/2010 |
| JP | 2013048282 A | 3/2013 |
| JP | 2013110154 A | 6/2013 |
| JP | 2014019436 A | 2/2014 |
| JP | 2015099238 A | 5/2015 |
| JP | 2016208012 A | 12/2016 |
| JP | 2017152655 A | 8/2017 |
| JP | 2017-533453 A | 11/2017 |
| JP | 2017535966 A | 11/2017 |
| JP | 2018063975 A | 4/2018 |
| JP | 2018-191006 A | 11/2018 |
| JP | 2019009438 A | 1/2019 |
| JP | 2019029473 A | 2/2019 |
| KR | 20130052944 A | 5/2013 |
| WO | 2004084318 A1 | 9/2004 |
| WO | 2006035212 A1 | 4/2006 |
| WO | 2007001099 A1 | 1/2007 |
| WO | 2009082121 A2 | 7/2009 |
| WO | 2010019594 A2 | 2/2010 |
| WO | 2010132552 A1 | 11/2010 |
| WO | 2010149027 A1 | 12/2010 |
| WO | 2011069747 A1 | 6/2011 |
| WO | 2011117056 A1 | 9/2011 |
| WO | 2011160051 A2 | 12/2011 |
| WO | 2012014857 A1 | 2/2012 |
| WO | 2013026440 A2 | 2/2013 |
| WO | 2014047113 A1 | 3/2014 |
| WO | 2014093063 A1 | 6/2014 |
| WO | 2015138102 A1 | 9/2015 |
| WO | 2016025325 A1 | 2/2016 |
| WO | 2016054092 A1 | 4/2016 |
| WO | 2016060677 A1 | 4/2016 |
| WO | 2016151112 A1 | 9/2016 |
| WO | 2017087312 A1 | 5/2017 |
| WO | 2017111827 A1 | 6/2017 |
| WO | 2017120320 A1 | 7/2017 |
| WO | 2017120341 A1 | 7/2017 |
| WO | 2017197576 A1 | 11/2017 |
| WO | 2018117382 A1 | 6/2018 |
| WO | 2018123280 A1 | 7/2018 |
| WO | 2018179540 A1 | 10/2018 |
| WO | 2020/157149 A1 | 8/2020 |

OTHER PUBLICATIONS

Buljan et al., "Ultra-Compact Multichannel Freeform Optics for 4xWUXGA OLED Microdisplays," Proc. SPIE 10676, Digital Optics for Immersive Displays, 9 pages (2018).

Fortuna, "Integrated Nanoscale Antenna-LED for On-Chip Optical Communication," UC Berkeley, 146 pages (2017).

Li et al., "Waveguiding in Vertical Cavity Quantum-Well Structure Defined by Ion Implantation," J. Lightwave Technol. 16, pp. 1498-1508 (1998).

Ogihara et al., "1200 Dots-Per-Inch Light Emitting Diode Array Fabricated by Solid-Phase Zinc Diffusion," IEICE Transactions on Electronics, 80;3, pp. 489-497 (1997).

Stevens et al., "Varifocal Technologies Providing Prescription and VAC Mitigation In HMDs Using Alvarez Lenses," Proc. SPIE 10676, Digital Optics for Immersive Displays, 18 pages (2018).

Tomioka et al., "Selective-Area Growth of III-V Nanowires and Their Applications," Journal of Materials Research, 26 (17), pp. 2127-2141 (2011).

Waldern et al., "DigiLens Switchable Bragg Grating Waveguide Optics for Augmented Reality Applications," Proc. SPIE 10676, Digital Optics for Immersive Displays, 17 pages (2018).

Wheelwright et al., "Field of View: Not Just A Number," Proc. SPIE 10676, Digital Optics for Immersive Displays, 8 pages (2018).

Yu et al., "Hybrid LED Driver for Multi-Channel Output with High Consistency," 2015 IEEE 11th International Conference on ASIC (ASICON), Chengdu, 4 pages (2015).

Huang et al., "Metasurface holography: from fundamentals to applications," Nanophotonics. 7(6), pp. 1169-1190 (2018).

Peng et al., "Magnetic-Mechanical-Electrical-Optical Coupling Effects in GaN-Based LED/Rare-Earth Terfenol-D Structures," Advanced Materials, 2014, vol. 26, No. 39, pp. 6767-6772.

Volz et al., "Influence of annealing on the optical and structural properties of dilute N-containing III/V semiconductor heterostructures," Journal of Crystal Growth, 2007, vol. 298, pp. 126-130.

International Search Report for International Patent Application No. PCT/EP2020/058547, mailed Mar. 28, 2022 (10 pages).

International Search Report for International Patent Application No. PCT/EP2020/058997, mailed Mar. 5, 2021 (10 pages).

Machine translation of Heuser, DE102006045702 A1 (Year: 2008).

\* cited by examiner

LIGHTING ARRANGEMENT, LIGHT GUIDE ARRANGEMENT AND METHOD

This patent application is a U.S.C. 371 National Stage entry of PCT Application No. PCT/EP2020/058549 filed Mar. 26, 2020, which claims the priority of German application DE 10 2019 113 793.4 dated May 23, 2019, the priority of German application DE 10 2019 118 082.1 dated Jul. 4, 2019, and the priority of international application PCT/EP2020/052191 dated Jan. 29, 2020, the disclosures of which are hereby incorporated by reference.

The invention relates to an illumination arrangement comprising a light emitting optoelectronic element and a light guide arrangement comprising a display device. The invention further relates to a method.

BACKGROUND

In some applications, the light generated by a display device must still be suitably guided and coupled out in order to achieve the desired effect. The ever-increasing size of displays, for example, or even TV sets, leads to different viewing angles depending on the position of the user, which can distort colors and also the contrast. In some other areas, the generated light beam should be already collimated so that it can be suitably coupled into further devices. Therefore, in the following, a concept is presented that is based on a curved emission surface, referred to as a foveated display. In addition, a low imaging error is to be achieved.

The starting point of the concept is an illumination arrangement having a light-emitting optoelectronic element and an optical device for beam conversion of the electromagnetic radiation generated by the light-emitting optoelectronic element, the optoelectronic element comprising a plurality of emission areas arranged in matrix form and each emission region being assigned a main beam direction.

In this regard, it has been recognized that the optical device downstream of the light emitting optoelectronic element in the optical path may be simplified if at least a portion, and preferably all, of the emission areas of the light emitting optoelectronic element are arranged such that their centers lie on a curved surface. In one aspect, this may be achieved with a concavely curved surface. As used herein, the center of an emission region is understood to be the intersection of the main beam direction with the electromagnetic radiation emitting surface of the emission areas.

In one aspect, the curved surface forms a spherical segment having an associated spherical center located on the optical axis of the optical device. For the preferred concave curved surface for arranging the centers of the emission areas, the spherical center is spaced apart from the light emitting optoelectronic element in the direction of the optical path. Alternatively, the curved surface is a rotating conic section, for example an ellipsoid, paraboloid or hyperboloid.

For a first embodiment, adjacent emission areas are tilted with respect to each other so that the main beam directions of the emission areas are angled with respect to each other. For a second, alternative embodiment, emission areas with a coinciding main beam direction are present which are arranged on different planes with a different distance in the main beam direction to the optical device.

For a further embodiment, it is proposed that the optical device forms a system optics, in particular an imaging projection optics. By arranging the emission areas, an improved compensation of the field curvature of the system optics is achieved. In addition, the imaging in the projection optics can be simplified. For a further design of these concepts, several non-planar collimating optical elements are provided between the emission areas and the system optics.

In one aspect, each individual emission region forms a separate Lambert emitter. Furthermore, the emission areas are very small in area and have maximum edge lengths in the range of 100 µm to 500 µm, in particular in the range of 150 µm to 300 µm. For one embodiment of the illumination arrangement, at least one of the emission areas is formed by the aperture of a primary optical element associated with an optoelectronic device or LED or of a converter element associated with an LED. Alternatively, the emission areas may comprise ready collimating elements, for example in the form of a photonic structure. In this case, the emission areas whose centers lie on a curved surface may be part of a monolithic pixelated optochip or these may be arranged in a plurality of separate optochips arranged on a non-planar IC substrate.

From the state of the art, a large number of different projection units are known for their ability to display images in specific image planes as required. Such projection units are used in various applications, for example in motor vehicles. In these applications of projection units, enlarged images are regularly displayed at a distance from the viewer. In some cases, the projection optics may additionally perform the function of a magnifying glass or other magnifying optics, so that the display device is magnified in the beam path in front of the projection optics.

In this context, display devices for motor vehicles are known from EP 1 544 660 and DE 197 51 649 A1. In the latter, an intermediate image is used on a ground-glass screen in order to display the image on the correct side of the windscreen for the driver by means of further optics. In this way, it is possible to display instruments, warning displays or other information that is important for the driver directly in the field of vision, so that the driver can see the information without having to take his eyes off the road ahead.

In addition, other projection units are known whose pixels emit light that is mixed from light of different colors. In these solutions, light is generated spatially separated and then mixed by suitable optical elements, such as an achromatic lens, and combined into a beam. In displays that generate color by means of pixels arranged in matrix form on a surface, the light must be sufficiently collimated to be able to resolve neighboring pixels of different colors, especially at high fill factors.

In contrast, other solutions suggest using LEDs with a low packing density. However, such a packing density leads to significant differences between punctually illuminated and dark areas when viewing a single pixel area. This so-called fly screen effect (screen door effect) is particularly evident at a short viewing distance and thus especially in applications such as AR glasses—or VR glasses.

Based on the known problems, further solutions will be proposed. It is considered not insignificant that the optics used for beam guidance and beam shaping have the highest possible efficiency, so that the optical losses are significantly minimized.

Thus, one aspect relates to a projection unit comprising an optoelectronic light emitting device and projection optics, wherein the optoelectronic light emitting device comprises a matrix of pixels for emitting visible light. Each pixel comprises a plurality of optoelectronic components or LEDs with spectrally different light emission, so that differently colored subpixels are formed. Here, each LED is separately drivable and may be connected to the driver circuits disclosed in this application, if applicable. In some aspects, the array of pixels includes one or more LED modules. Various measures such as a transparent cover electrode, a photonic structure, or the like may be provided to improve outcoupling and directionality. In one embodiment, the matrix may be formed by pixel modules (each having three subpixels) attached to a support substrate. The support substrate may include leads and drive circuitry and may be fabricated in a different material system than the matrix.

Furthermore, a separate collimation optics is associated with each pixel, which is connected upstream of the projection optics for increasing the fill factor. According to the invention, the collimation optics are designed in such a way that enlarged and mutually superimposed intermediate images of the LEDs of the respective pixel are generated in the beam path upstream of the projection optics. Accordingly, the collimation optics associated with each individual pixel not only increases the degree of illumination of a pixel, but additionally enables a spatial correction of the radiation of the LEDs forming subpixels by superimposing the sub-pixel intermediate images as accurately as possible, which enables an efficient coupling of light into the projection optics following in the beam path. It should be mentioned here that such an optical system would be suitable for the concepts presented here, which in part provide redundant subpixel elements.

It is expedient to design the collimation optics in such a way that the degree of overlap of the intermediate images of the LEDs belonging to the same pixel is as high as possible. An overlap of the intermediate images of the LEDs of a pixel of at least 85% and further of at least 95% of their intermediate image area has proven to be suitable. Furthermore, an embodiment is preferred, for which the intermediate images of the LEDs are virtual intermediate images. In one aspect, the collimating optics generates a virtual image of the sub-pixels such that the size of the virtual image of a sub-pixel corresponds to the size of the pixel. Further, the collimating optics is preferably disposed between the LEDs of a pixel and the projection optics.

The LEDs emitting light of different colors may occupy equal surface areas of the pixel, or the surface areas respectively occupied by the subpixels may be adapted to the light emission and may be of different sizes. For one embodiment, it is provided that the subpixel emitting green light occupies the largest surface area of the pixel compared to the other two subpixels, or at least green light is emitted over a larger surface area. This results from the fact that the eye is most sensitive to the green color. Further, it is convenient if the surface area of an RGB pixel occupied by red light emitting subpixels is larger than the surface area occupied by blue light emitting subpixels. According to this embodiment, green light is emitted over a larger surface area of the pixel than red light, and red light is in turn emitted over a larger surface area of the pixel than blue light. By means of the proposed collimating optics of the pixel, intermediate images are generated in the beam path in front of the projection optics by the LEDs of the subpixels, which are of different sizes and are arranged in different locations, and which have a high degree of overlap.

According to a further aspect, small size LEDs are used such that there are large surface areas in the individual pixels that do not emit light. Preferably, the semiconductor light emitting devices of a pixel occupy no more than 30% and more preferably no more than 15%, most preferably no more than 10% of the pixel area. This ensures that optical and electrical crosstalk between the individual pixels is prevented. Preferably, the subpixels are arranged in such a way that they are not located directly at the edge of a pixel and are not adjacent to one another. In addition to LEDs, the term LEDs also includes color-converted LEDs or VCSELs with such an edge length or LEDs illuminated optical waveguide end pieces.

The collimation optics associated with each pixel offers the advantage that the light emitted by the subpixels is converted into a precollimated beam, which is then advantageously available for the generation of an image by at least one further optical element. By using at least one suitable collimating optical element, pre-collimated light beams can thus be generated so that, in turn, optical crosstalk between the individual light beams emitted by the sub-pixels is prevented or at least reduced. According to one embodiment, the collimating optics comprise at least one holographic optical element (HOE) which compensates for the different positions of the three semiconductor light emitting devices on the surface of the pixel. Alternatively or in addition, it is conceivable that this function is effected by a refractive optical element (ROE) forming part of the collimating optics. Likewise, it is conceivable that a diffractive optical element (DOE) is used, in a complementary or alternative manner, in order to achieve a suitable compensation of the different positions of the semiconductor lighting devices on the illuminated surface in the intermediate image of the pixel.

In further aspects, the projection unit is further embodied. In one embodiment, the projection unit comprises projection optics arranged downstream of the collimation optics in the beam path. With the aid of the projection optics, an image or a further intermediate image is generated from the individual intermediate images generated with the aid of the collimation optics, which image or further intermediate image is used directly or in further processed form to display the desired information to the viewer. In this case, the projection optics have suitable optical elements, such as deflection mirrors, beam splitters and/or lenses, which are preferably controlled by a control unit and can thus be moved in a targeted manner in order to bring about beam deflection and/or beam reshaping as required, so that information is presented in an easily understandable and perceptible form on a display, on a matt screen and/or as a virtual image, for example in front of the windscreen of a motor vehicle.

A proposed projection unit, according to at least one of the previously described embodiments may be used to generate an image for a head-up display in a motor vehicle.

BRIEF DESCRIPTION OF THE FIGURES

In the following, exemplary embodiments of the invention are explained in detail in connection with figure representations. These show, schematically in each case, the following.

DETAILED DESCRIPTION

The following embodiments relate primarily to display devices and displays, and thus to basic units and modules of optoelectronic devices. However, the present invention is not limited to this application or to the devices illustrated. Rather, the principles and embodiments presented can be generalized to be suitable for a variety of electronic applications and uses where scaling, i.e., a combination of like components, is necessary.

Figure 1:
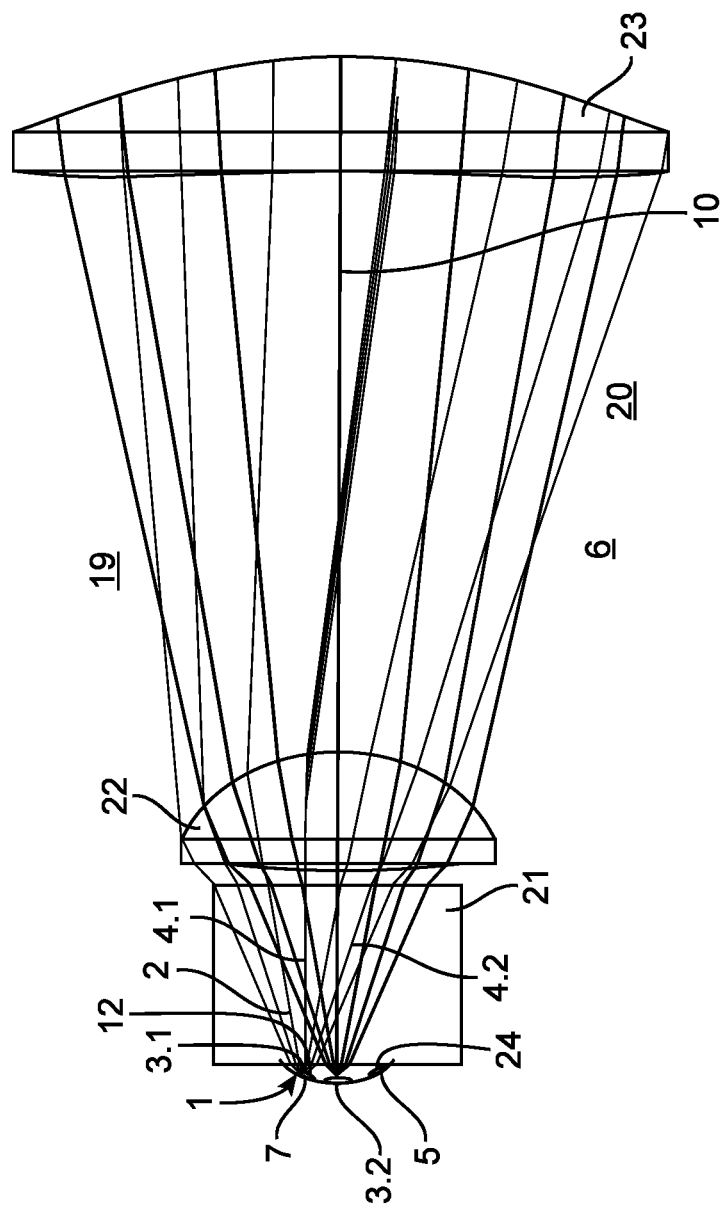
FIG. 1 shows a first embodiment of a light guiding concept of a curved light surface according to some aspects of the proposed concept.

FIG. 1 shows an example of a light guide, in which by means of a foveated display a suitable beam guidance is achieved. In FIG. 1, an illumination arrangement of, for example, a display device or display is proposed comprising a light emitting optoelectronic element 1 and an optical device 6 for beam conversion or beam shaping of electromagnetic radiation generated by the light emitting optoelectronic arrangement 1. In this regard, a light emitting optoelectronic arrangement 1 comprises a plurality of LEDs which emit light of one color during operation. The light emitting optoelectronic arrangement 1 is configured such that the LEDs emit different colors. Three LEDs form part of an entire pixel as subpixels. In one embodiment, the light-emitting optoelectronic arrangement thus comprises a plurality of such pixels.

The optical device 6 constitutes a system optics 19 in the form of an imaging projection optics 20 and comprises, in the optical path, successively a plane-parallel lens 21 and a first aspherical lens 22 and a second aspherical lens 23, which realize an imaging of the light-emitting optoelectronic device 1.

Furthermore, FIG. 1 shows that the light emitting optoelectronic device 1 comprises a plurality of emission areas 3.1, 3.2 arranged in matrix form. These each comprise one or more LEDs (for different colours). Optionally, the LEDs may already comprise primary optics 12. These primary optics may comprise converter elements, decoupling structures or even photonic crystals in order to achieve a certain beam shaping already at the light emission. Each of the emission areas 3.1, 3.2 is associated with a primary beam direction 4.1 and 4.2. For at least partial compensation of the field curvature arising in the optical device, the centers 7 of the emission areas 3.1, 3.2 are arranged on a curved surface 5 which, for the present embodiment example, forms a spherical segment 24 with an associated spherical center 30 on the optical axis 10 of the optical device 6.

For a possible dimensioning, for a light-emitting optoelectronic arrangement 1 with the diameter D of 3.7 mm, a radius R of 10 mm is selected for the curved surface 5 for the arrangement of the emission areas 3.1, 3.2, and for the plane-parallel lens 21 of the optical device 6 following in the beam path, a material with a refractive index of at least 1.6 and a thickness in the direction of the optical axis 10 of at least twice the diameter D are used.

Figure 2:
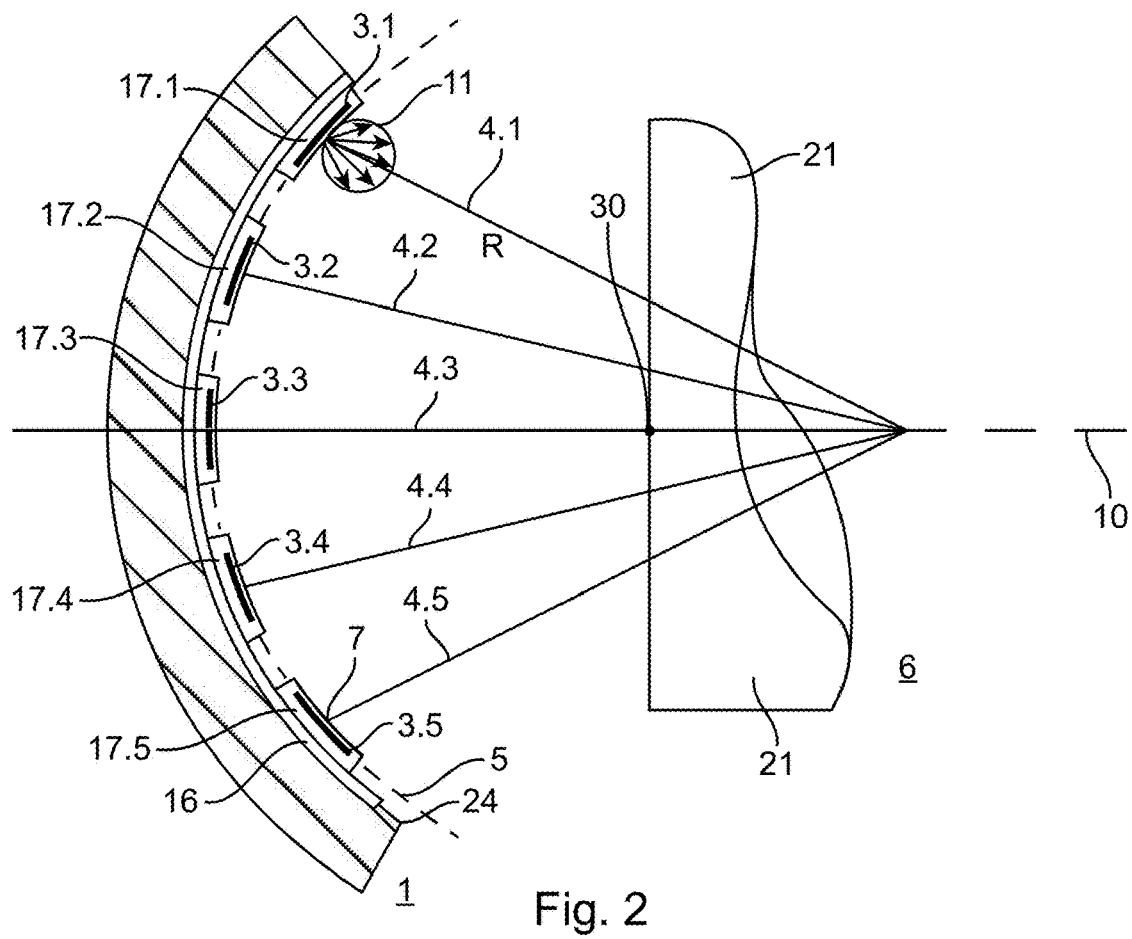
FIG. 2 shows an enlarged partial view for the light guide design example with separate LEDs on a non-planar IC substrate.

FIG. 2 shows an enlarged partial view for an embodiment example of the illumination arrangement with a light-emitting optoelectronic arrangement 1, which comprises several emission areas 3.1-3.5, which are formed by apertures of the primary optics of separate optochips 17.1-17.5 in the form of LEDs. Shown is an arrangement of the separate optochips 17.1-17.5 on a non-planar IC substrate 16, such that the centers 7 of the emission areas 3.1-3.5 lie on a concave curved surface 5. Each of the emission areas 3.1-3.5 forms a Lambert radiator 11 to which a main beam direction 4.1-4.5 is assigned, wherein due to the non-planar IC substrate in the form of a spherical segment 24 facing the optical device 6 the main beam directions 4.1-4.5 have a common point of intersection on the optical axis 10 of the optical device 6. By means of primary optical elements 12 (cf. FIG. 249), the Lambertian emission of the emission areas 3.1-3.5 can be transformed into a non-Lambertian emission, in particular into an emission with a narrower aperture angle.

Figure 3:
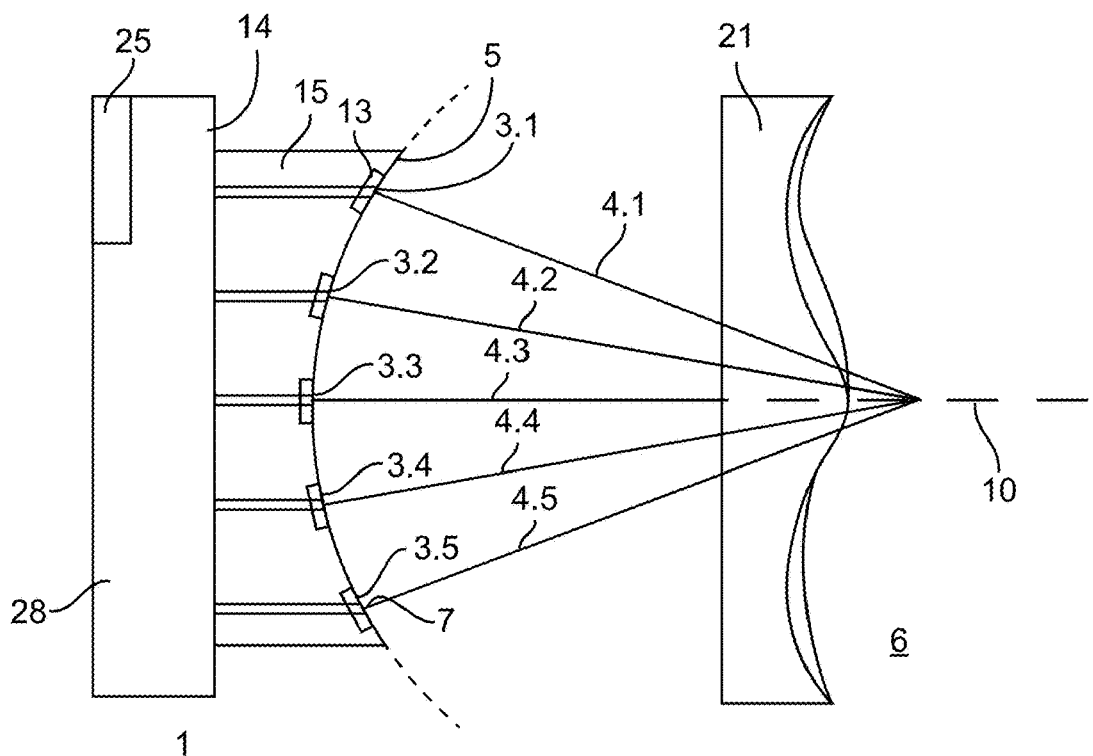
FIG. 3 illustrates a third version of a light guide with a monolithic pixelated chip according to further aspects.

FIG. 3 shows an alternative embodiment in enlarged partial view, with an optical device 6 shown only in section. A planar IC substrate 28 is evident with a schematically simplified sketched control device 25, which typically comprises driver components and interface and memory elements. A monolithic pixelated optochip 14 is arranged on the planar IC substrate 28, comprising a light-emitting optoelectronic device 1 manufactured in a common process and having a plurality of emission areas 3.1-3-5 located on a concave curved surface 5 of a region 15 of the chip 14, each of which is formed by a converter element 13. According to the previous embodiment, the main emission directions 4.1-4.5 of the emission areas 3.1-3.5 are angled with respect to each other and intersect on the optical axis 10 of the optical device 6.

Figure 4:
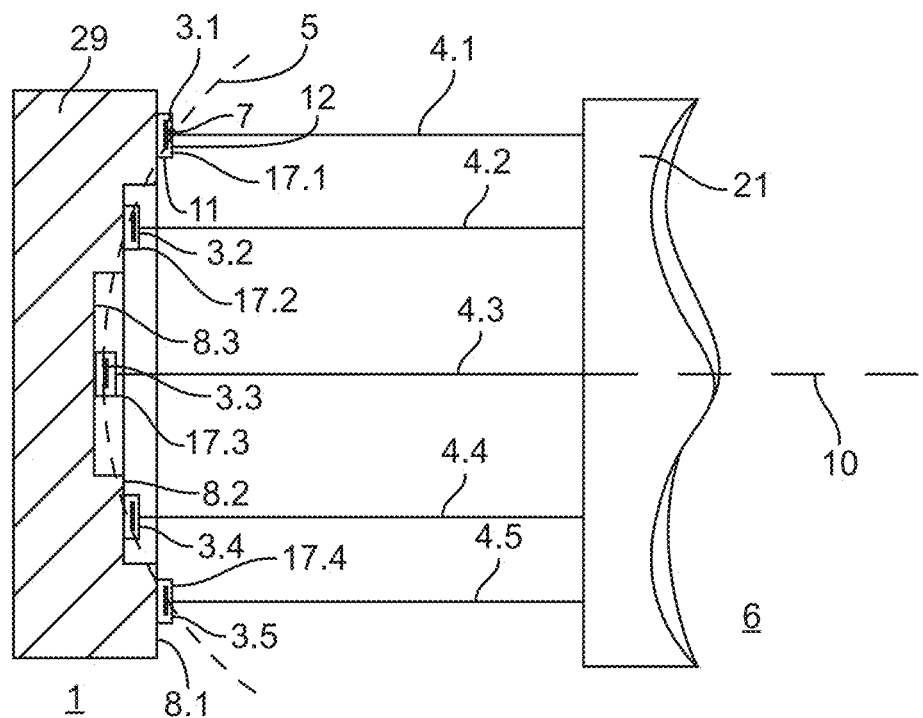
FIG. 4 shows a fourth embodiment of a light guide with some aspects.

FIG. 4 shows a fourth embodiment of an illumination device with a light-emitting optical arrangement 1, comprising a stepped IC substrate 29. On concentrically arranged ring surfaces 8.1, 8.2, 8.3 of the stepped IC substrate 29, separate optochips 17.1-17.5 formed by LEDs 11 are arranged in such a way that the centers 7 of the emission areas 3.1-3.5 formed by primary optical elements 12 of the respective LEDs 11 lie on a concavely curved surface 5, while the main beam directions 4.1-4.5 of the emission areas 3.1-3.5 have a coinciding orientation. Consequently, the distances of the separate opto-chips 17.1-17.5 from the plane-parallel lens 21 of the optical device 6 and thus the beam cross-section in the widening beam path in front of the optical device 6 differ if there is an arrangement on different ring planes 8.1-8.3.

Figure 5:
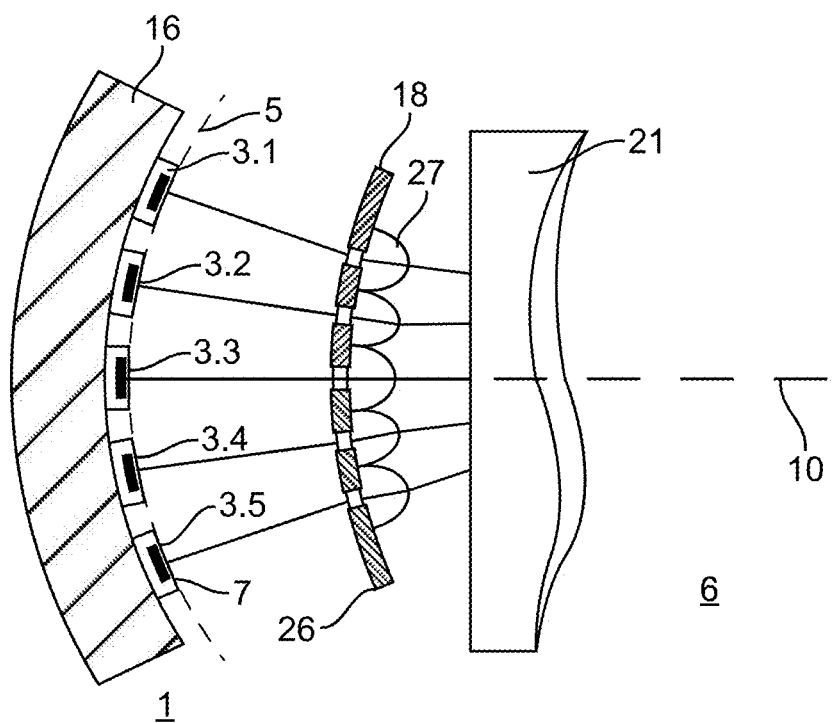
FIG. 5 is a further embodiment of one of the above embodiments according to some aspects of the concept presented.

FIG. 5 shows a further embodiment of the invention starting from the variant shown in FIG. 4, wherein in addition a collimating optical element 18, which is also concavely curved, is arranged between the centres 7 of the emission areas 3.1-3.5 arranged on a concavely curved surface 5 and the plane-parallel lens 21 of the optical device 6. For the illustrated embodiment, the collimating optical element 18 comprises a curved pinhole 26 and a curved lens arrangement 27 forming a radiation angle filter. The functional components of the collimating optical element 18 may be associated with individual or multiple emission areas 3.1-3.5. For an embodiment not shown in detail, each functional component of the collimating optical element 18 serves to pre-collimate a plurality of emission areas 3.1-3.5 belonging to a pixel and radiating with different colors.

Figure 6:
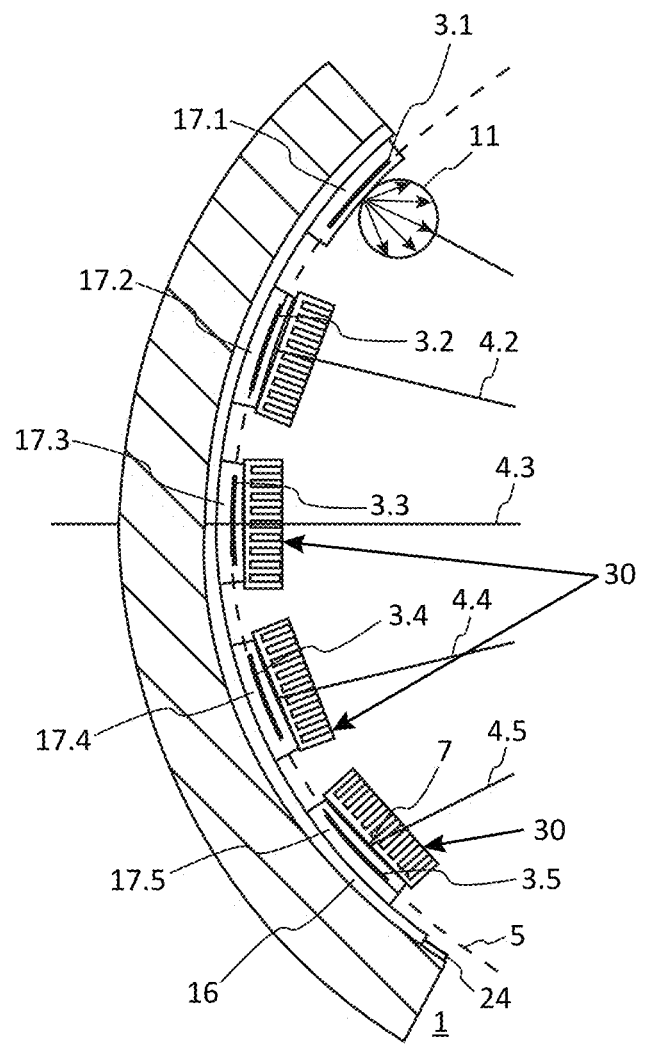
FIG. 6 is a further embodiment of the example in FIG. 2, with additional light-shaping structures.
Figure 7:
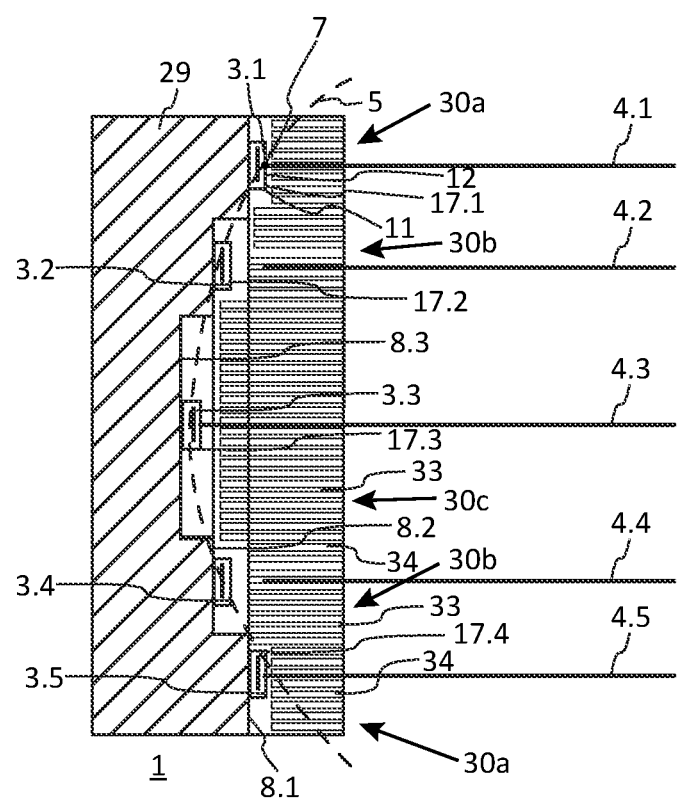
FIG. 7 is a supplement to the embodiment of FIG. 5, whereby here a photonic structure is arranged in the beam path.

FIG. 6 shows an addition to this in that the optochips 17.1 to 17.5 are formed as LED arrays with an additional light-forming structure on the upper side of the emission surface. Thereby, a light guiding is improved, and the radiation characteristic of the individual optochips is changed. A higher directionality of the emitted light results from the light-shaping structure, which is implemented, for example, as a photonic crystal in a semiconductor material of the optochip. The light-shaping structure can be formed in various ways. The embodiment of FIG. 7 is based on the example of FIG. 4, where a light-shaping structure is also formed, but its width varies and follows the shape or surface of the body 1.

Figure 8A:
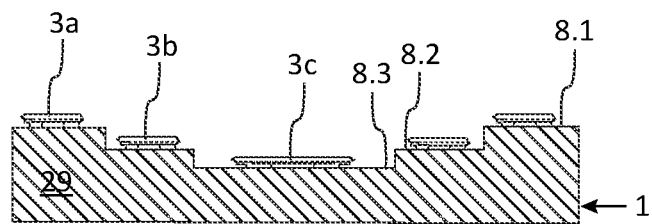
FIG. 8A shows another embodiment based on the example shown in FIG. 4.
Figure 8B:
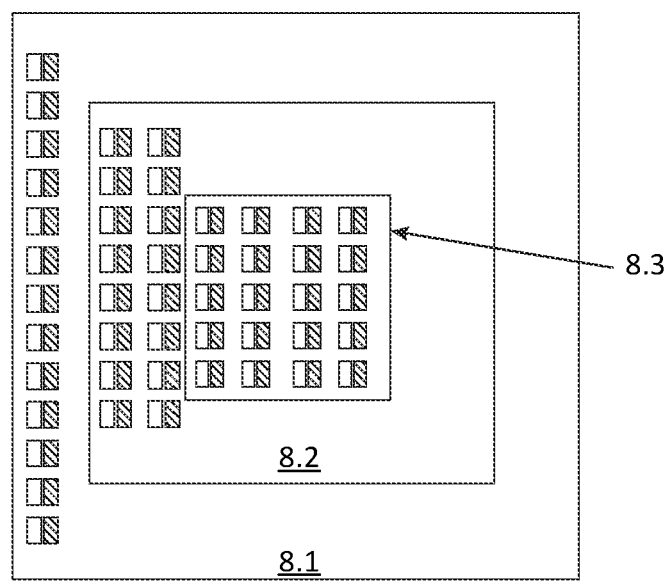
FIG. 8B is a top view of one embodiment of a stepped substrate.

FIGS. 8A and 8B show another embodiment in cross-section and top view. In this embodiment, concentrically arranged surfaces 8.1, 8.2, 8.3 of the stepped IC substrate comprise LEDs 3a, 3b and 3c. In a plan view, this is shown in more detail with reference to a further embodiment, wherein the stepped substrate comprises rectangular stepped surfaces. The individual optoelectronic components or light emitting diodes are designed as horizontal diodes, i.e. they have their two contacts on one side. This is indicated in FIG. 8B by the two different surfaces (white and hatched). Depending on the stage in the IC substrate, several light-emitting diodes are provided, some of which are arranged here on the substrate.

Figure 9A:
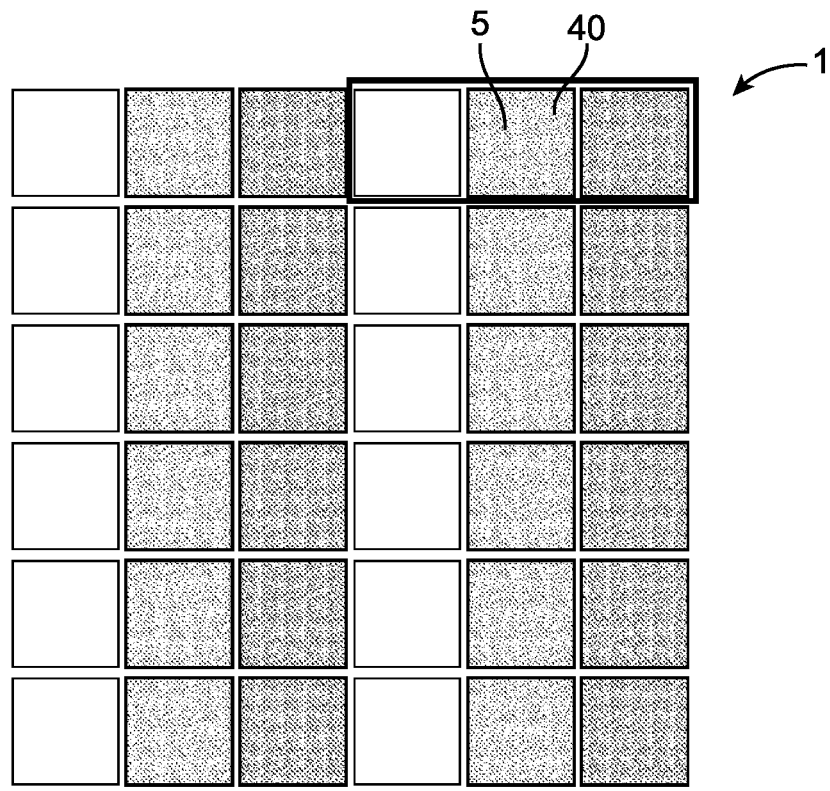
FIG. 9A shows a matrix with RGB pixels, which has a high fill factor.
Figure 9B:
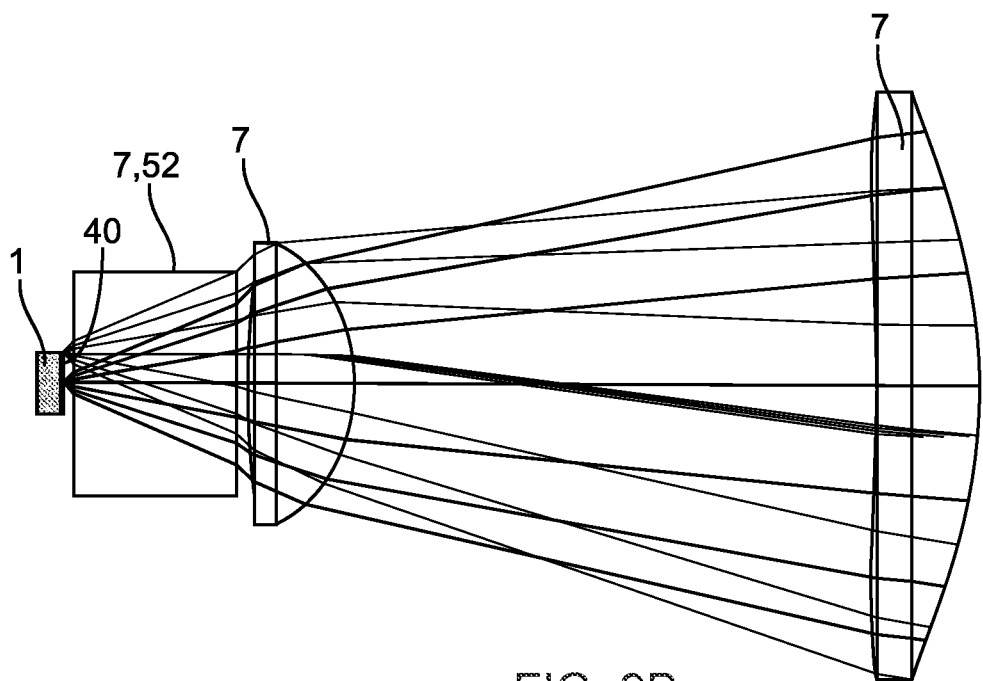
FIG. 9B is a schematic representation of the beam delivery in a conventional projection unit.

The following figures describe the further aspect referred to in this application. FIG. 9A illustrates in plan view a prior art RGB emitter array comprising an optoelectronic lighting device 1 formed as a matrix with RGB pixels 40 emitting red, green or blue light. The RGB pixels 40 are characterized by a high fill factor. This means that a large part of the area 5 of the individual RGB pixels 40 is used as light emitting area. FIG. 9B shows in a schematic representation an example of the beam guiding which is present in projection units with a projection optics 7. The projection optics 7 comprises all 3 lenses shown in FIG. 9B, including the lens or plate 52. It can be seen that the radiation emitted from the individual RGB pixels 40 is not collimated. As shown in FIG. 9B, only the rays emitted by the RGB pixels 40 with a radiation angle between +45° and −45° enter the elements of the projection optics 7 located downstream of the plate 52. Therefore, since the RGB pixels 40 emit light according to Lambert's law of radiation, without collimation of the radiation, part of the radiation emitted by the RGB pixels 40 cannot be used for image formation, which ultimately means a loss of efficiency.

Figure 10:
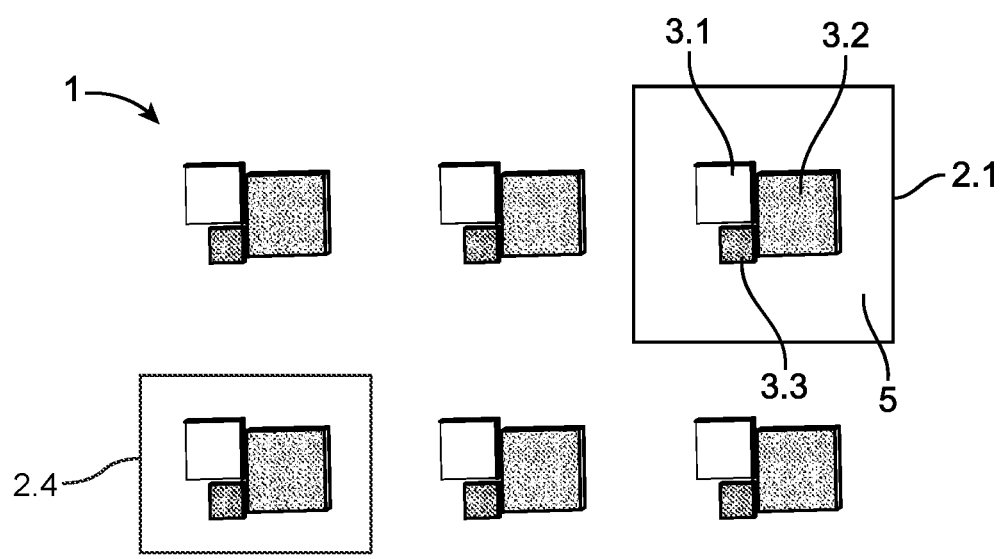
FIG. 10 shows an embodiment of an implemented matrix with RGB pixels having a small fill factor according to some aspects of the proposed concept.

FIG. 10 shows a schematically simplified top view of an optoelectronic lighting device 1 with a proposed RGB emitter array according to some aspects disclosed herein with six pixels, wherein the associated pixel area 5 is shown for the exemplary pixel 2.1 provided with reference signs. The pixel 2.1 comprises separately applied sub-pixel forming LEDs 3.1, 3.2, 3.3 formed as LEDs emitting red, green and blue light for the illustrated embodiment example. The individual pixels 2.1 are characterized by a small fill factor, so that only a comparatively small part of the pixel area 5 is occupied by the LEDs 3.1, 3.2, 3.3. Moreover, the LEDs 3.1, 3.2, 3.3 are arranged in such a way that a comparatively large distance is formed between the individual light-emitting surfaces of the sub-pixels. On the one hand, the LEDs 3.1, 3.2, 3.3 or the LEDs are arranged at a distance from the edge of the pixels 2.1 such that optical and/or electrical crosstalk does not occur between adjacent pixels 2.1. On the other hand, the LEDs 3.1, 3.2, 3.3 are also arranged within the individual pixels 2.1 in such a way that optical and electrical crosstalk between the individual semiconductor lighting devices 3.1, 3.2, 3.3 of a pixel 2.1 can be prevented or at least minimized. The arrangement of the individual LEDs 3.1, 3.2, 3.3 takes into account the radiation pattern and the light output required to produce the desired images. In addition, as shown here in the leftmost pixel, a reflective elevation 2.4 may be configured. Likewise, a transparent ceiling electrode may be provided. Embodiments of this are disclosed in this application.

Figure 11:
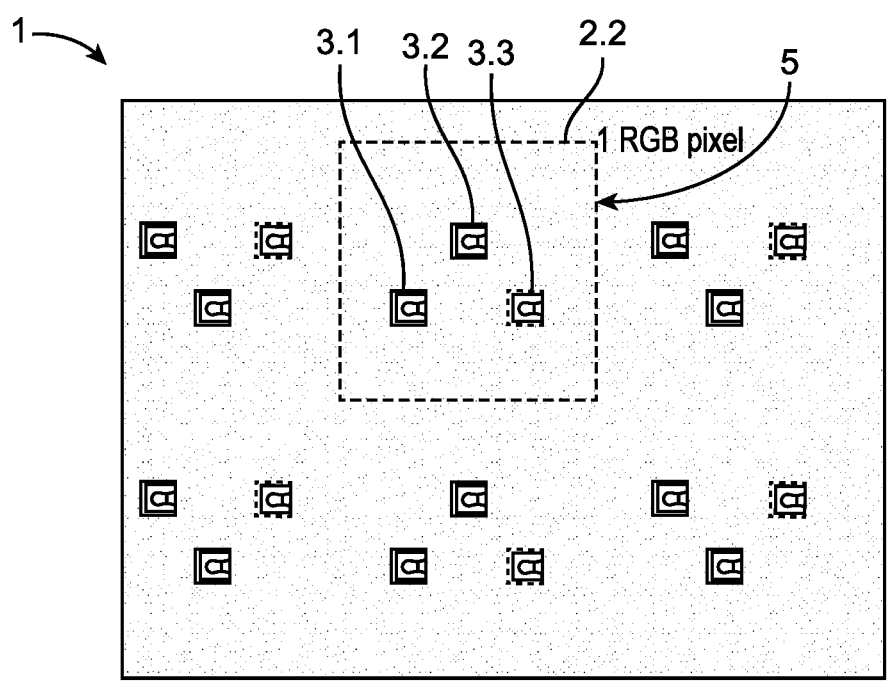
FIG. 11 shows another embodiment of an implemented matrix with RGB pixels having a small fill factor according to some aspects.

FIG. 11 shows a top view of a matrix formed of RGB pixels forming an optoelectronic lighting device 1 of a proposed projection unit. Exemplarily, a pixel area 5 of the pixel 2.2 is shown dashed. The pixel 2.2 comprises three sub-pixel forming semiconductor lighting devices 3.1, 3.2, 3.3 which emit red, green or blue light and which are arranged in the form of a triangular arrangement on the surface 5 of the pixel 2.2. This embodiment may also be surrounded with reflective layer.

Figure 12:
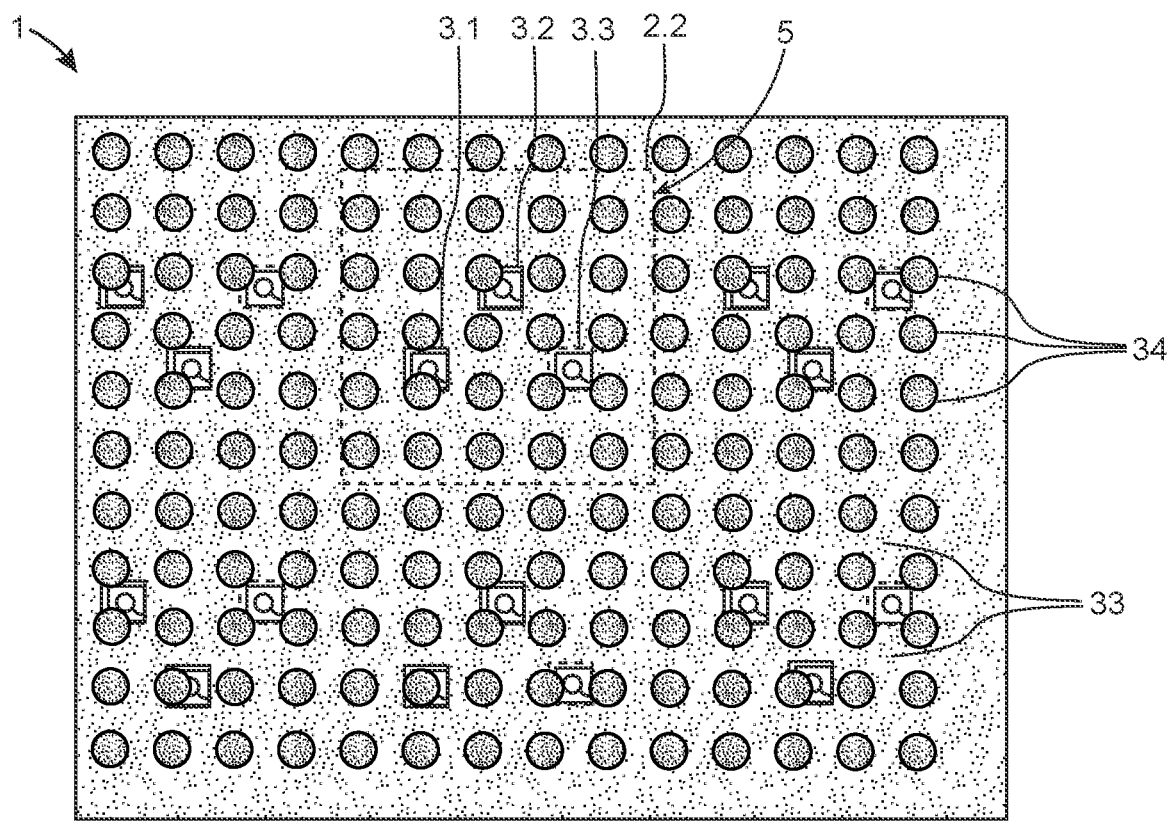
FIG. 12 illustrates a top view of an embodiment of a matrix with a light-forming structure disposed thereon.

Depending on the application, the matrix of pixels with LEDs of a small form factor presented here can be supplemented by a light-shaping or light-converting structure. FIG. 12 shows a top view of such an arrangement. In this case, a light-shaping structure with areas 33 and 34 is formed on the matrix. The areas 34 are designed as pillars or holes in the transparent layer 33 covering the matrix. The layer 33 comprises a different refractive index compared to the pillars 34 or holes 34. Thus, as shown in the plan view, there is a periodic variation of the refractive index in the two spatial directions. In this way, a photonic structure or two-dimensional photonic crystal is formed over the matrix of individual LEDs and pixels. Thus, the light of at least one wavelength can be suitably shaped by an appropriate choice of periodicity.

Figure 13:
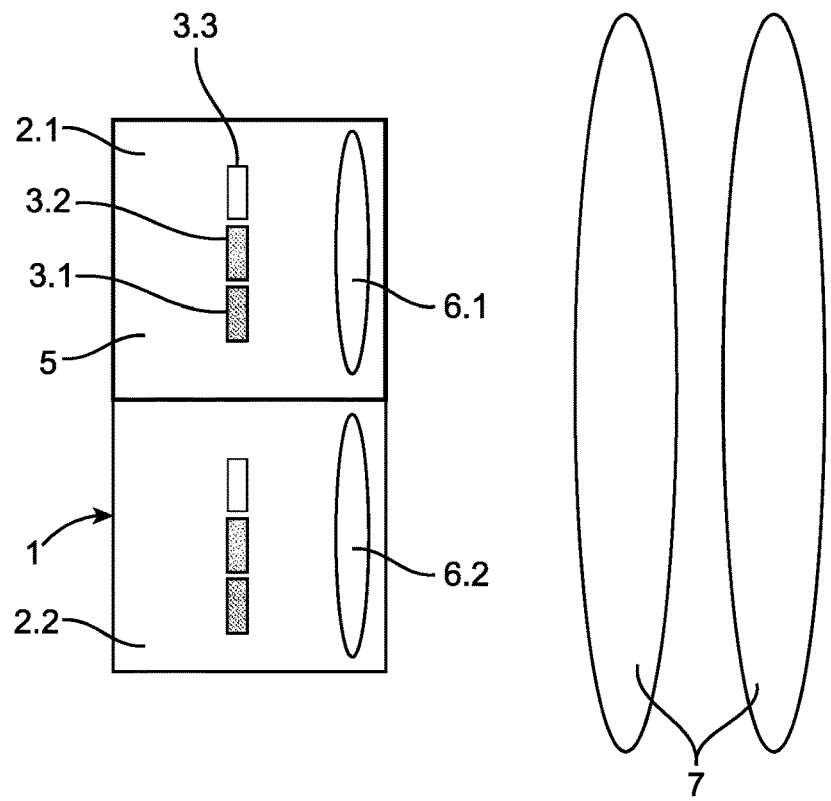
FIG. 13 shows a schematic representation of a projection unit according to some aspects of the proposed principle.

Furthermore, FIG. 13 shows a schematic view of the different components of a proposed projection unit. Such a projection unit has an optoelectronic lighting device 1, with pixels 2.1, 2.2 forming a matrix, having a low fill factor and each comprising LEDs 3.1, 3.2, 3.3 emitting light of different colours, namely red, green and blue light. According to some proposed aspects, for each pixel 2.1, 2.2 a collimating optics 6.1, 6.2 is provided which collimates the light emitted by the LEDs 3.1, 3.2, 3.3 and images it into a preferably virtual intermediate image 8.1, 8.2. With the aid of projection optics 7, the intermediate image 8.1, 8.2 of the LEDs 3.1, 3.2, 3.3 is directed onto a display, screen or other display unit not shown in detail, which may also be the windscreen of a motor vehicle, in order to generate an image which can be perceived by the viewer in the desired size, orientation and spacing.

Figure 14:
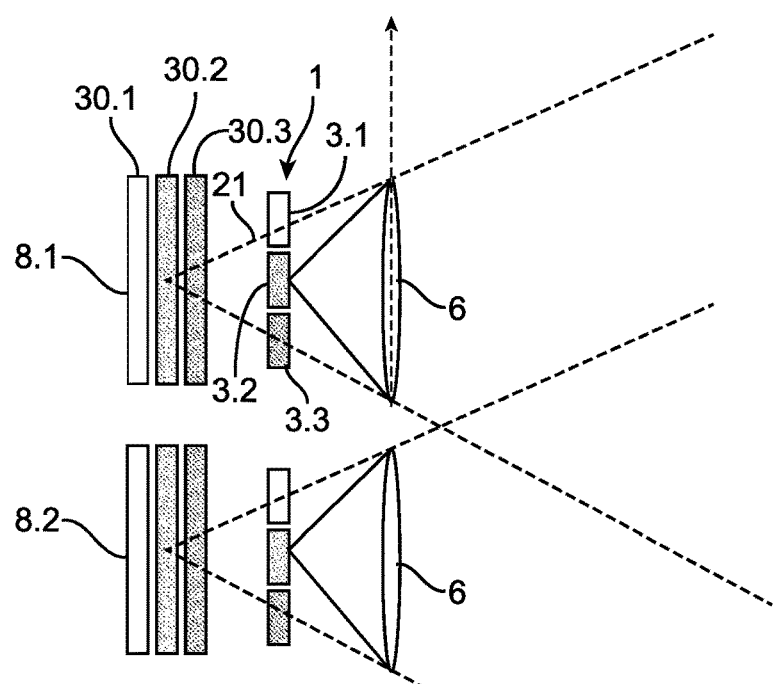
FIG. 14 shows, as a schematic representation, the generation of an intermediate image by the projection unit of the previous figure.

Furthermore, FIG. 14 shows the proposed spatial correction which leads to a superposition of the enlarged virtual intermediate images 8.1, 8.2 of the LEDs 3.1, 3.2, 3.3. Consequently, the collimation optics 6.1, 6.2 is designed in such a way that the size of the intermediate images 8.1, 8.2 of the LEDs 3.1, 3.2, 3.3 substantially corresponds to the size of the respective pixel 2.1, 2.2 and, in addition, the different positions and sizes of the LEDs 3.1, 3.2, 3.3 are largely compensated for the superposition of the intermediate images 8.1, 8.2. Preferably, the intermediate images 30.1, 30.2, 30.3 of the LEDs 3.1, 3.2, 3.3 overlap over at least 85% and preferably over at least 95% of their intermediate image area. The intermediate images 30.1, 30.2, 30.3 of the LEDs 3.1, 3.2, 3.3 may also overlap over at least 70%, 80% or 90% of their intermediate image area. It is further preferred that the total area of the overlapping intermediate images 30.1, 30.2, 30.3 of the LEDs 3.1, 3.2, 3.3 of the respective pixel 2.1, 2.2 corresponds to at least 80% and preferably at least 90% of the pixel area 5. The total area of the overlapping intermediate images 30.1, 30.2, 30.3 of the LEDs 3.1, 3.2, 3.3 of the respective pixel 2.1, 2.2 may correspond to at least 70%, 80% or 90% of the pixel area 5.

Figure 15:
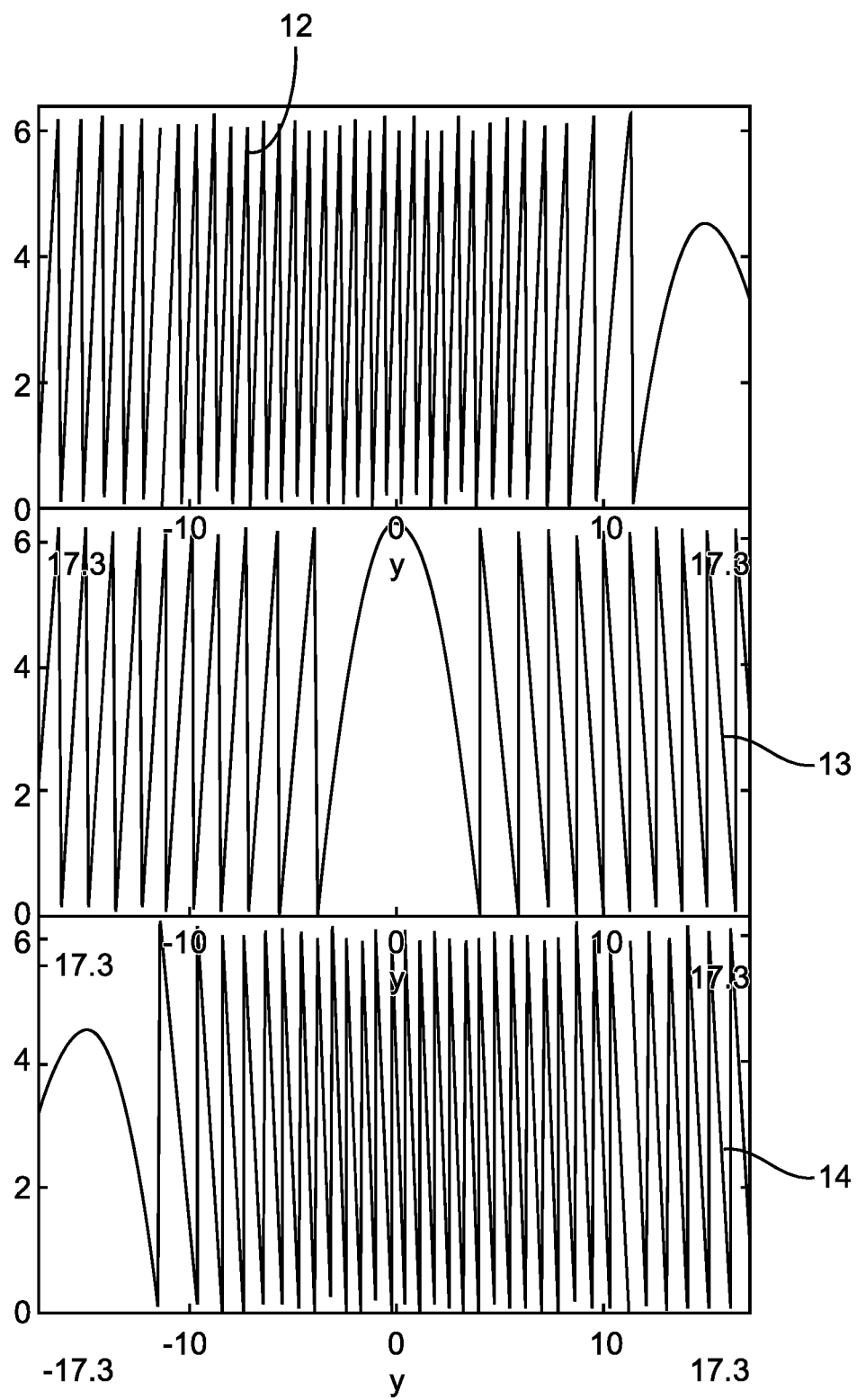
FIG. 15 shows chromatic phase function of the collimating optics of FIG. 13.

The collimation optics 6.1, 6.2 associated with each individual pixel 2.1, 2,2 can be effected with support of a holographic optical element (HOE), a refractive optical element (ROE) or a diffractive optical element (DOE). For this purpose, FIG. 15 shows the chromatic phase function 12, 13, 14 of the collimation optics 6.1, 6.2, 6.3 required in each case for the three different LEDs 3.1, 3.2, 3.3 of the respective pixel 2.1, 2.2. The upper graph here shows the chromatic phase function 12 for the LED 3 emitting red light, the middle graph shows the phase function 13 of the collimating optics 6.1, 6.2 for the LED 3.2 emitting green light, and the lower graph shows the necessary chromatic phase function 14 of the collimating optics 6.1, 6.2 for the LED 3.3 emitting blue light.

Figure 16:
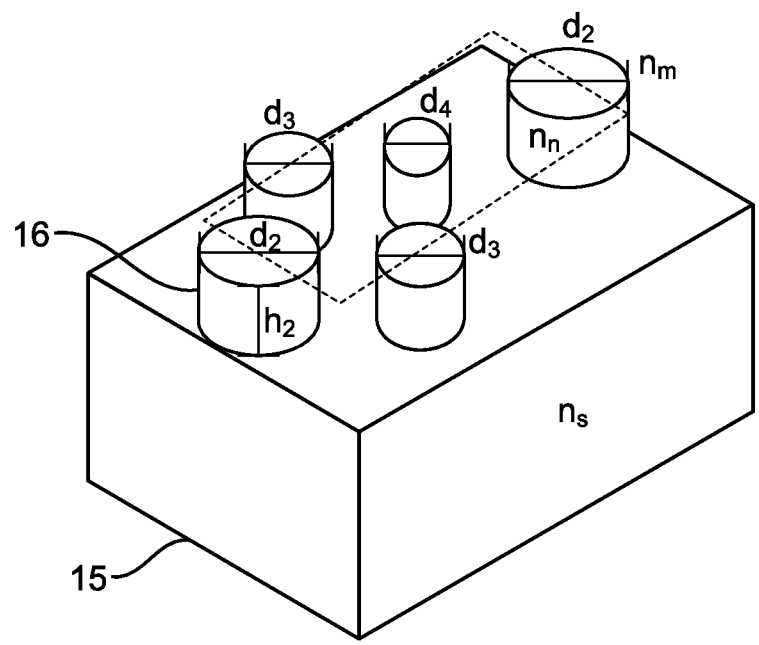
FIG. 16 illustrates a meta-lens of the collimating optics according to some embodiments of the proposed concept.

FIG. 16 shows an embodiment for which the collimating optics 6 is realized by means of a meta-lens 15. Such a meta-lens 15 may be designed to form either a refractive optical element or a diffractive optical element. In an advantageous manner, such meta-lenses 15 have at least two spaced-apart regions which have been structured in different ways. For example, it is conceivable that a lattice-like structuring is provided in a first region of the meta-lenses, while the second region of such a meta-lens 15 comprises a circular structure. It is advantageous if the meta-lens 15 comprises, at least in some regions, a binary structure and/or is made of a dielectric material. a further aspect on the FIG. 16 arises when considering that the column structure can be arranged periodically or quasi-periodically. This results in a region with a periodic variation of the refractive index.

Figure 17:
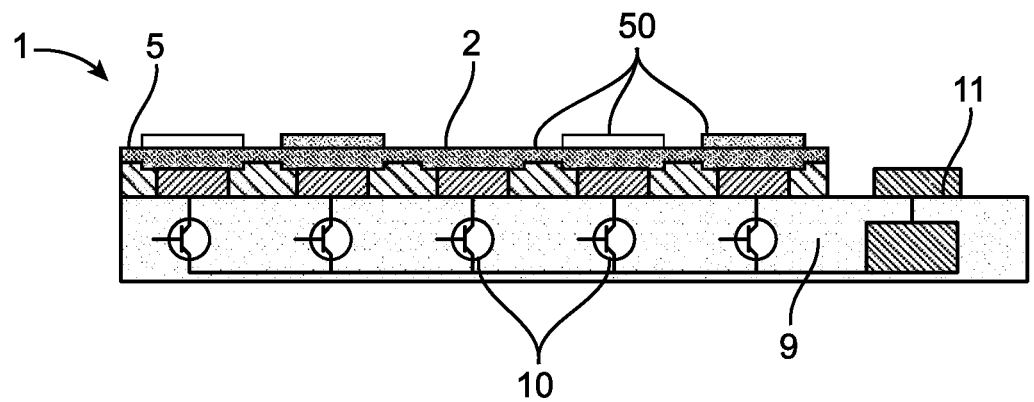
FIG. 17 shows a schematic side view of a monolithic array with multiple integrated LEDs to explain some aspects of the proposed concept.

FIG. 17 shows a side view of a monolithic optochip comprising the optoelectronic light-emitting device 1 for a projection display according to the invention. The optochip has a silicon substrate 9 on which the individual pixels 2 with the subpixels provided therein are located. In order to supply the optochip with the required electrical energy, the optochip has a power connection 11 and conductor tracks suitable for this purpose. The power supply and control of the individual light-emitting pixels 2 is carried out with the aid of a CMOS array 10. The light generation at the subpixels is implemented with the aid of LEDs, whereby LEDs are preferably used which emit blue or ultraviolet light which is converted into light with the required colour with the aid of suitable converter elements or suitable converter material.

On the surface of the optochip, there are pixels 2 in which subpixels 50 each emitting red, green and blue light are arranged. In this case, the individual subpixels 50 each form a pixel 2 with a low fill factor, so that the individual light-emitting areas within a pixel 2 only occupy a part of the area of the pixel 2 compared to the areas that do not emit light, and are sufficiently spaced apart from one another such that optical and electrical crosstalk between the individual subpixels 50 and between adjacent pixels 50 is reliably prevented or at least significantly minimized.

The pixels 2, each formed by three subpixels 50, are each associated with collimation optics, not shown in detail in FIG. 270, which effect collimation of the radiation emitted by the subpixels 3 and spatial correction. According to the invention, the collimation optics 6 generate intermediate images of the subpixels 50 whose size corresponds to the size of a pixel 2. In addition, the collimation optics are designed in such a way that the different positions and sizes of the individual sub-pixels in the intermediate image are compensated for. In addition to the embodiment shown in FIG. 17 with a monolithic optochip, it is also conceivable to arrange different chips, each having one or a plurality of pixels or subpixels, on a common substrate and to contact them electrically. Preferably, the subpixels 50 of the pixels 2 are formed by LEDs which emit light with the respectively required color, in particular red, green or blue light. In principle, it is conceivable here to use LEDs that directly emit light with the desired color and/or to convert the light emitted by LEDs, in particular blue light, into light with the required color with the aid of suitable converter elements and converter materials. Furthermore, it is conceivable to design the subpixels 50 as superluminescent diodes, VCSELs or edge-emitting lasers. Likewise, it is conceivable to implement the individual subpixels 50 by means of end pieces of optical fibers that conduct light with the corresponding color.

The invention claimed is:

1. An illumination arrangement comprising:
a light-emitting optoelectronic arrangement;
an optical device for beam conversion of electromagnetic radiation generated by the light-emitting optoelectronic arrangement, the optical device including two spherical lenses arranged linearly along a beam path of the electromagnetic radiation;
wherein the light emitting optoelectronic arrangement comprises a plurality of emission areas arranged in matrix form;
wherein each emission area is associated with a main beam direction;
wherein each emission area comprises a plurality of LEDs each configured to emit a different color; and
wherein at least a part of the emission areas is arranged so that the centers of the emission areas lie on a curved surface.

2. The illumination arrangement according to claim 1, wherein the curved surface has a concave curvature.

3. The illumination arrangement according to claim 1, wherein the main beam directions of the emission areas are at an angle to one another.

4. The illumination arrangement according to claim 1, wherein emission areas with a coinciding main beam direction are present which are arranged on different planes with a different distance in the main beam direction to the optical device.

5. The illumination arrangement according to claim 1,
wherein the curved surface forms a spherical segment, an associated spherical center being located on the optical axis of the optical device; or
wherein the curved surface is in the form of at least one portion of a rotated conical section including an ellipsoid, paraboloid or hyperboloid.

6. The illumination arrangement according to claim 1, wherein the emission areas, the centers of which are arranged on the curved surface, each form Lambert radiators.

7. The illumination arrangement according to claim 1, wherein at least one of the emission areas is the aperture of a primary optical element associated with an LED or of a converter element associated with an LED.

8. The illumination arrangement according to claim 1, wherein the emission areas whose centers lie on a curved surface are part of a monolithic pixelated optochip.

9. The illumination arrangement according to claim 8, wherein the monolithic pixelated optochip comprises a plurality of LEDs arranged in rows and columns.

10. The illumination arrangement according to claim 1, wherein the emission areas form the surface of an outcoupling structure.

11. The illumination arrangement according to claim 1, wherein the emission areas, the centers of which lie on a curved surface, are associated with separate LEDs arranged on a non-planar IC substrate.

12. The illumination arrangement according to claim 1, wherein the optical device comprises a system optics and between the system optics and the emission areas there is a curved collimating optical element or a plurality of non-planar collimating optical elements.

13. The illumination arrangement according to claim 1, wherein the optical device comprises system optics forming imaging projection optics.

14. The illumination arrangement according to claim 1, wherein the light-emitting optoelectronic arrangement comprises a layer which comprises a plurality of drive elements including current sources for individually driving each of the emission areas.

15. A method of manufacturing an illumination arrangement, comprising:
providing a light-emitting optoelectronic device;
providing an optical device for beam conversion of an electromagnetic radiation generated by the light-emitting optoelectronic element, the optical device including two spherical lenses arranged linearly along a beam path of the electromagnetic radiation;
wherein the optoelectronic element comprises a plurality of emission areas arranged in matrix form; and
wherein at least a part of the emission areas is arranged so that the centers of the emission areas lie on a curved surface.

16. The method according to claim 15, wherein separate LEDs are arranged on a non-planar IC substrate to create the emission areas.

17. The method according to claim 15, wherein at least one of the emission areas is formed by the aperture of a primary optic associated with an LED or of a converter element associated with an LED.

18. A light guide arrangement, comprising:
a display device;
projection optics;
wherein the display device comprises a matrix of pixels for emitting visible light;
wherein each pixel comprises a plurality of LEDs having spectrally different light emission;
wherein each pixel comprises associated therewith a separate collimating optics upstream of the projection optics; and
wherein the collimation optics are designed so that enlarged and mutually superimposed intermediate images of the LEDs of the respective pixel are generated in a beam path in front of the projection optics.

19. The light guide arrangement according to claim 18, wherein the intermediate images of the LEDs of the respective pixel generated by the collimation optics overlap each other over at least 70%, 80% or 90% of their intermediate image area.

20. The light guide arrangement according to claim 18, wherein the intermediate images are LEDs virtual intermediate images.

21. The light guide arrangement according to claim 18, wherein the collimating optics are arranged between the LEDs of a pixel and the projection optics.

22. The light guide arrangement according to claim 18, wherein the LEDs of a pixel occupy no more than 50%, more preferably no more than 35% and most preferably no more than 20% of the pixel area.

23. The light guide arrangement according to claim 18, wherein the LEDs are formed as color-converted LEDs or as VCSELs or as edge-emitting laser diodes and comprise illuminated optical waveguide end pieces.

24. The light guide arrangement according to claim 18, wherein the collimating optics is configured so that the total area of the overlapping intermediate images of the LEDs of the respective pixel corresponds to at least 70%, 80% or 90% of the pixel area.

25. The light guide arrangement according to claim 18, wherein the collimating optics comprises a holographic optical element (HOE) and/or refractive optical element (ROE) and/or a diffractive optical element (DOE).

26. The light guide arrangement according to claim 18, wherein the radiation emitted by the projection optics is directed indirectly or directly onto a display.

27. The light guide arrangement according to claim 18, wherein each pixel comprises an LED arrangement.

28. The light guide arrangement according to claim 18, wherein a plurality of pixels of the matrix each comprise a lens disposed over the LEDs.

29. The light guide arrangement according to claim 18, wherein the at least some pixels of the matrix comprise a redundant LED.

30. The light guide arrangement according to claim 18, wherein the light guide arrangement is configured to generate an image on a video wall or a head-up display.

* * * * *